US011496833B2

(12) United States Patent
Gill et al.

(10) Patent No.: US 11,496,833 B2
(45) Date of Patent: Nov. 8, 2022

(54) POWERED LINE ARRAY SPEAKER SYSTEM WITH REDUNDANT NETWORK AND POWER SUPPLY

(71) Applicant: Bose Corporation, Framingham, MA (US)

(72) Inventors: David Charles Gill, Lincoln, RI (US); Benjamin Grant Karnavas, Providence, RI (US); Jeffrey Alan Rocha, Paxton, MA (US); Curtis Rex Reed, Salt Lake City, UT (US); Richard Gerald Ireland, Jr., Coeur D'Alene, ID (US); James Kurt Mahan, Salt Lake City, UT (US); Jeremy Lynn Garff, Sandy, UT (US)

(73) Assignee: Bose Corporation, Framingham, MA (US)

( * ) Notice: Subject to any disclaimer, the term of this patent is extended or adjusted under 35 U.S.C. 154(b) by 181 days.

(21) Appl. No.: 16/944,510

(22) Filed: Jul. 31, 2020

(65) Prior Publication Data

US 2022/0038816 A1 Feb. 3, 2022

(51) Int. Cl.
*H04R 3/12* (2006.01)
*H04R 1/40* (2006.01)
*H03F 3/183* (2006.01)

(52) U.S. Cl.
CPC .............. *H04R 3/12* (2013.01); *H03F 3/183* (2013.01); *H04R 1/403* (2013.01); *H03F 2200/03* (2013.01); *H04R 2201/028* (2013.01); *H04R 2201/403* (2013.01)

(58) Field of Classification Search
CPC .... H04R 3/12; H04R 1/403; H04R 2201/028; H04R 2201/403; H03F 3/183; H03F 2200/03
See application file for complete search history.

(56) References Cited

U.S. PATENT DOCUMENTS

| 7,333,478 | B2 | 2/2008 | Wiebe |
| 9,906,320 | B2 | 2/2018 | Fukuda et al. |
| 2020/0099626 | A1 | 3/2020 | Yoneda et al. |

FOREIGN PATENT DOCUMENTS

| GB | 2278216 A | 11/1994 |
| WO | 2013018141 A1 | 2/2013 |

OTHER PUBLICATIONS

PCT International Search Report and Written Opinion for International Application No. PCT/US2021/042748, dated Nov. 22, 2021, 45 pages.

*Primary Examiner* — David L Ton
(74) *Attorney, Agent, or Firm* — Hoffman Warnick LLC (57) ABSTRACT

Various implementations include speaker systems. In one implementation, a self-powered speaker system includes: a first module, having: a processor; an audio signal and control connector coupled with the processor and enabling audio signal and control communication between the processor and another module in the speaker system; a dedicated power supply for the speaker system; a front end backup power supply; and a power connector coupled with the dedicated power supply and the front end backup power supply, the power connector enabling input power to the dedicated power supply and output power from the front end backup power supply.

21 Claims, 7 Drawing Sheets

POWERED LINE ARRAY SPEAKER SYSTEM WITH REDUNDANT NETWORK AND POWER SUPPLY

TECHNICAL FIELD

This disclosure generally relates to speaker systems. More particularly, the disclosure relates to self-powered speaker systems, line arrays and related methods of controlling network data connections and power supplies.

BACKGROUND

In many applications, the reliability of a speaker system (e.g., line array speaker systems) is paramount. For example, in professional touring and stadium settings, performance interruptions due to speaker system failure are completely unacceptable. While some conventional speaker systems have robust network connections between modules, the power supply remains a common failure point in these systems. As such, these conventional speaker systems remain vulnerable to performance interruptions.

SUMMARY

All examples and features mentioned below can be combined in any technically possible way.

Various implementations include self-powered speaker systems, line arrays and related methods of controlling network data connections and power supplies.

In some particular aspects, a self-powered speaker system includes: a first module having: a processor; an audio signal and control connector coupled with the processor and enabling audio signal and control communication between the processor and another module in the speaker system; a dedicated power supply for the speaker system; a front end backup power supply; and a power connector coupled with the dedicated power supply and the front end backup power supply, the power connector enabling input power to the dedicated power supply and output power from the front end backup power supply.

In other particular aspects, a self-powered line array includes: a set of speaker systems, each including: a first module having: a processor; an audio signal and control connector coupled with the processor and enabling audio signal and control communication between the processor and another module in the speaker system; a dedicated power supply for the speaker system; a front end backup power supply; and a power connector coupled with the dedicated power supply and the front end backup power supply, the power connector enabling input power to the dedicated power supply and output power from the front end backup power supply.

In additional particular aspects, a method of controlling a first module in a line array speaker system includes: sending and receiving audio signal and control communications with another module in the speaker system; and sending backup power from a front end backup power supply to a front end power supply for a control circuit that comprises a field programmable gate array (FPGA) section for controlling the audio signal and control communications.

Implementations may include one of the following features, or any combination thereof.

In some cases, the input power is AC power from an input power source, and the output power is DC power that is sent to a front end power supply for a control circuit.

In certain aspects, the control circuit includes a field programmable gate array (FPGA) section for controlling the audio signal and control communication.

In particular implementations, the output power is available for use in response to a front end power supply failure.

In some aspects, the output power is sufficient to support the FPGA section for a defined period.

In certain cases, the system further includes a second module having: a processor; an audio signal and control connector coupled with the processor and enabling audio signal and control communication between the processor and another module in the speaker system; a dedicated power supply for the second module; a front end backup power supply; and a power connector coupled with the dedicated power supply and the front end backup power supply, the power connector enabling input power to the dedicated power supply and output power from the front end backup power supply.

In particular aspects, the other module in the speaker system includes another module that has a daisy chained connection with the module.

In some cases, each of the speaker systems further includes a second module, having: a processor; an audio signal and control connector coupled with the processor and enabling audio signal and control communication between the processor and another module in the speaker system; a dedicated power supply for the second module; a front end backup power supply; and a power connector coupled with the dedicated power supply and the front end backup power supply, the power connector enabling input power to the dedicated power supply and output power from the front end backup power supply.

In certain implementations, each speaker system further includes: an input power source; a front end power supply; and a control circuit connected with the front end power supply.

In particular cases, the input power is AC power from the input power source, and the output power is DC power that is sent to the front end power supply for powering the control circuit.

In some cases, the line array further includes: a power distribution block configured to provide power to each of the speaker systems; and a signal distribution block configured to provide digital audio signals and control signals to each of the set of speaker systems, where, other than the first module, at least one additional module is configured to receive digital audio signals and control signals directly from the signal distribution block, and where the at least one additional module is located between the first module and a last module in the set.

In certain implementations, the digital audio signals sent to the first module and the at least one additional module are controlled by a field programmable gate array (FPGA), where the FPGA mitigates latency between the digital audio signals received at the first module and the at least one additional module.

In particular aspects, the FPGA forwards digital audio signals as packetized datagrams from network audio input interfaces to corresponding network audio thru interfaces, and begins transmitting each packetized datagram before completely receiving the packetized datagram.

In certain cases, the FPGA forwards the packetized datagrams without regard for a destination address.

In some cases, a method further includes receiving input AC power from a power source, where the backup power includes DC power.

Two or more features described in this disclosure, including those described in this summary section, may be combined to form implementations not specifically described herein.

The details of one or more implementations are set forth in the accompanying drawings and the description below. Other features, objects and benefits will be apparent from the description and drawings, and from the claims.

It is noted that the drawings of the various implementations are not necessarily to scale. The drawings are intended to depict only typical aspects of the disclosure, and therefore should not be considered as limiting the scope of the implementations. In the drawings, like numbering represents like elements between the drawings.

DETAILED DESCRIPTION

This disclosure is based, at least in part, on the realization that a redundant power supply and audio signal and control connection can enhance reliability in self-powered speaker systems.

Commonly labeled components in the FIGURES are considered to be substantially equivalent components for the purposes of illustration, and redundant discussion of those components is omitted for clarity. Numerical ranges and values described according to various implementations are merely examples of such ranges and values, and are not intended to be limiting of those implementations. In some cases, the term "approximately" is used to modify values, and in these cases, can refer to that value +/-a margin of error, such as a measurement error, which may range from up to 1-5 percent.

Some of the greatest contributors to the cost of producing a live performances are labor and transportation (e.g., trucking). In other terms, the quantity of equipment and the time required to perform setup with that equipment significantly impact a performance's cost. Self-powered speaker systems help to address this issue by reducing the cabling and electronics that run from the floor or other central control module to the speaker arrays, which are commonly suspended in the air or mounted on stands. Additionally, daisy-chaining connections between speakers in a given array reduces the weight of cabling relative to a commonly used star-type (or hub-and-spoke type) connection.

However, as described herein, the power supply remains a common failure point in conventional speaker systems such as line-array speaker systems. These conventional speaker systems remain vulnerable to performance interruptions, making them unacceptably risky in professional and touring applications. In contrast to conventional systems, the self-powered speaker systems and line arrays according to various implementations enable redundant audio signal and control communication between modules, and also have a redundant power supply. In particular cases, the speaker system includes a set of loudspeakers, that are connected in a daisy chain. In various implementations, each loudspeaker includes a dedicated power supply. Additionally, each loudspeaker includes a front end backup power supply and a power connector that enables output power from the power supply. In certain cases, the output power is sufficient to support a control circuit including a field programmable gate array (FPGA) that controls audio signal and control communication, and is available for use in response to a front end power supply failure.

Figure 1:
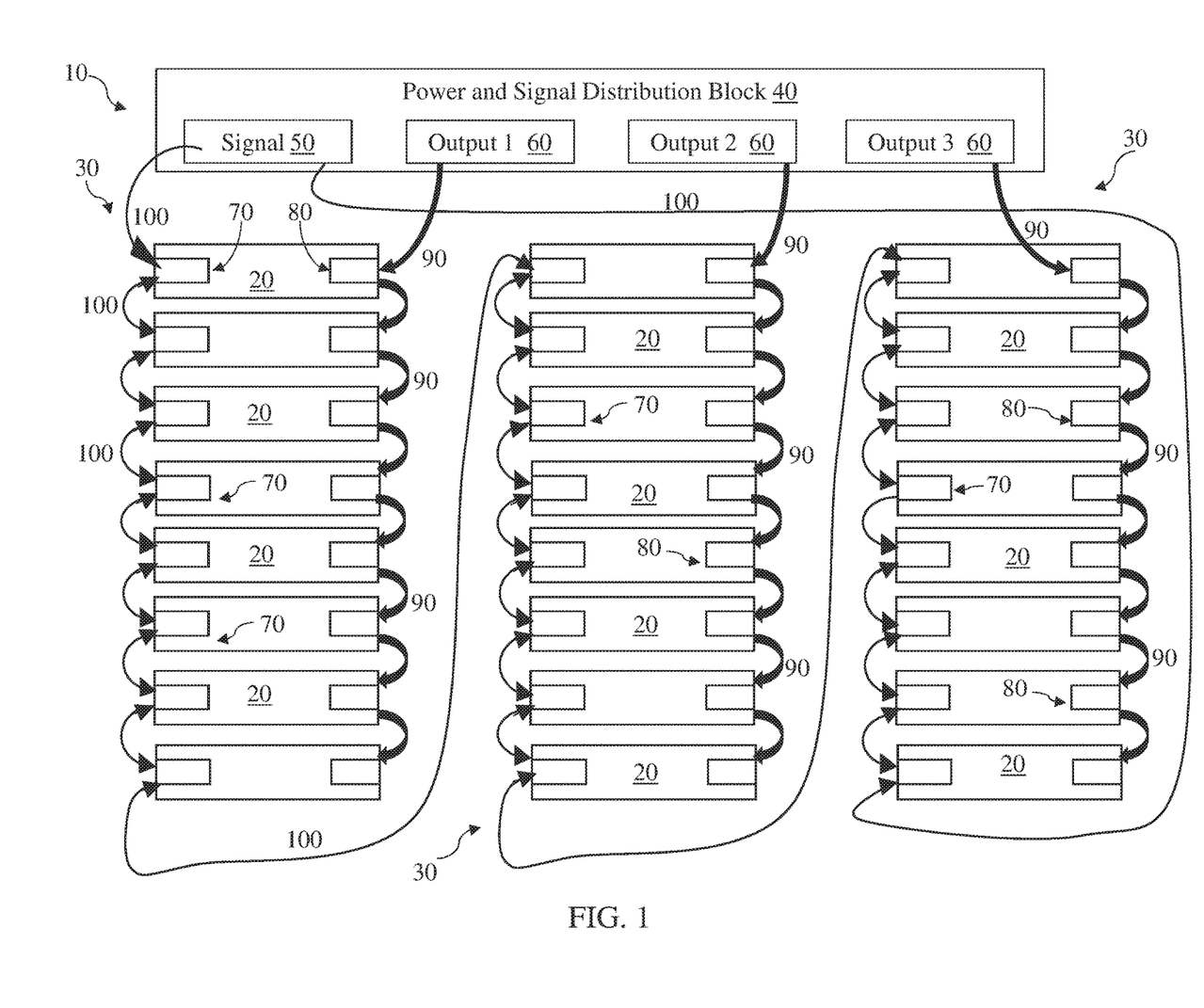
FIG. 1 shows a schematic diagram of a speaker system according to various implementations.

FIG. 1 is a schematic diagram illustrating a system 10 according to various implementations. As shown, the system 10 can include a plurality of loudspeakers 20, arranged in sets 30. In cases where loudspeakers 20 are stacked in a group, or line, the sets 30 of loudspeakers 20 can also be referred to as line arrays. In certain cases, sets 30 can include up to eight (8) loudspeakers 20 connected in a daisy chain. Three sets 30 are illustrated in this example, although a greater or lesser number of sets 30 can be used in accordance with the various implementations. Each set 30 is connected to a power and signal distribution block 40, which can include a signal output module 50 and power output modules 60 (three shown in this example) for the speaker sets 30. In some cases, the signal output module 50 and power output modules 60 are contained within a common power and signal distribution block 40, however, in other cases, these modules 50, 60 are separated. Each loudspeaker 20 has an audio signal and control input/output/throughput connection 70, as well as a power input/output/throughput connection 80. It is understood that input, output and/or throughput connections can be separated in practice, and are shown collectively strictly for simplicity of illustration. Power connections 90 are shown as bolded lines to indicate multi-phase (i.e., three phase) power connections without showing three distinct phases. Signal connections (e.g., audio and/or control signal connections) 100 are illustrated in relatively lighter lines than the power connections 90. In certain cases, loudspeaker sets 30 have redundant signal connections 100 with the signal output module 50, such that a second, third, fourth, etc., loudspeaker 20 in a first set 30 provides a signal connection with a loudspeaker 20 in a second set 30, in addition to a direct connection between the signal output module 50 and one of the loudspeakers 20 in that second set 30.

Additionally, as shown in FIG. 1, signal connections 100 are bidirectional and are supplied to a second, third, fourth, and in some cases a last loudspeaker 20 in a given set 30, in addition to a first loudspeaker 20 in that set 30. In some examples, e.g., as shown in FIG. 1, signal connections 100 are made to both a first loudspeaker 20 and a last loudspeaker 20 in a given set 30, and are bidirectional. In these cases, in the event of a signal, cable and/or module failure, the set 30 of loudspeakers 20 can be fed from the bottom up (last loudspeaker 20 first) as well as the top down (first loudspeaker 20 first). If, for example, one or more loudspeakers 20 in a set 30 fails to transmit signals to a downstream loudspeaker 20, the bottom up connection enables transmission of audio and/or control signals to one or more downstream loudspeakers 10.

Figure 2:
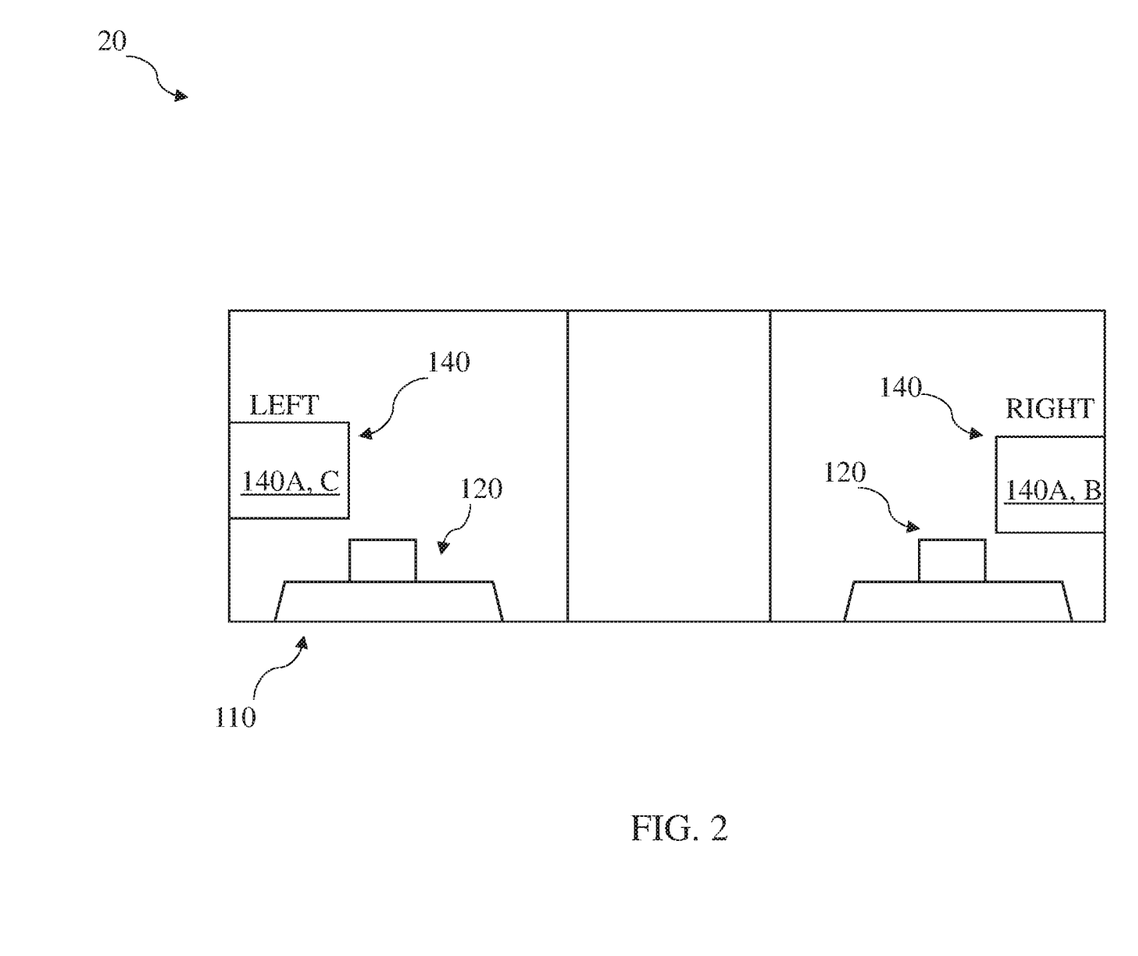
FIG. 2 shows a schematic top cross-section of a speaker according to various implementations.

As noted herein, each loudspeaker 20 can include one or more transducers and one or more modules. An example schematic top view of an individual loudspeaker 20 is shown in FIG. 2. For example, each loudspeaker 20 can include a housing 110 containing a set of transducers 120 (e.g., at least a left (L) and right (R) transducer) for providing an audio output. In some cases, the transducers 120 can include mid, high or mid-to-high frequency range transducers, e.g., with a horn attached. Transducers 120 can also include low frequency range transducers, such as those without an attached horn. The loudspeaker 20 can include one or more modules 140 for controlling power, audio signals and control signals. In some cases, the modules 140 are denoted with (A), (B), etc., indicators to signify module type. For example, an amplifier module 140A (FIG. 3) provides amplified audio signals to transducers 120. A power module 140B (FIG. 4) is configured to provide redundant power connectivity and distribution as described herein. A network (communications) module 140C (FIG. 5) is configured to provide digital audio signal distribution. In some cases, modules 140 can be assigned as left (L) and right (R) loudspeaker modules. However, the features of one module 140 can be included in other modules, and other numbers of modules 140 can be used to perform functions according to various implementations.

Figure 3:
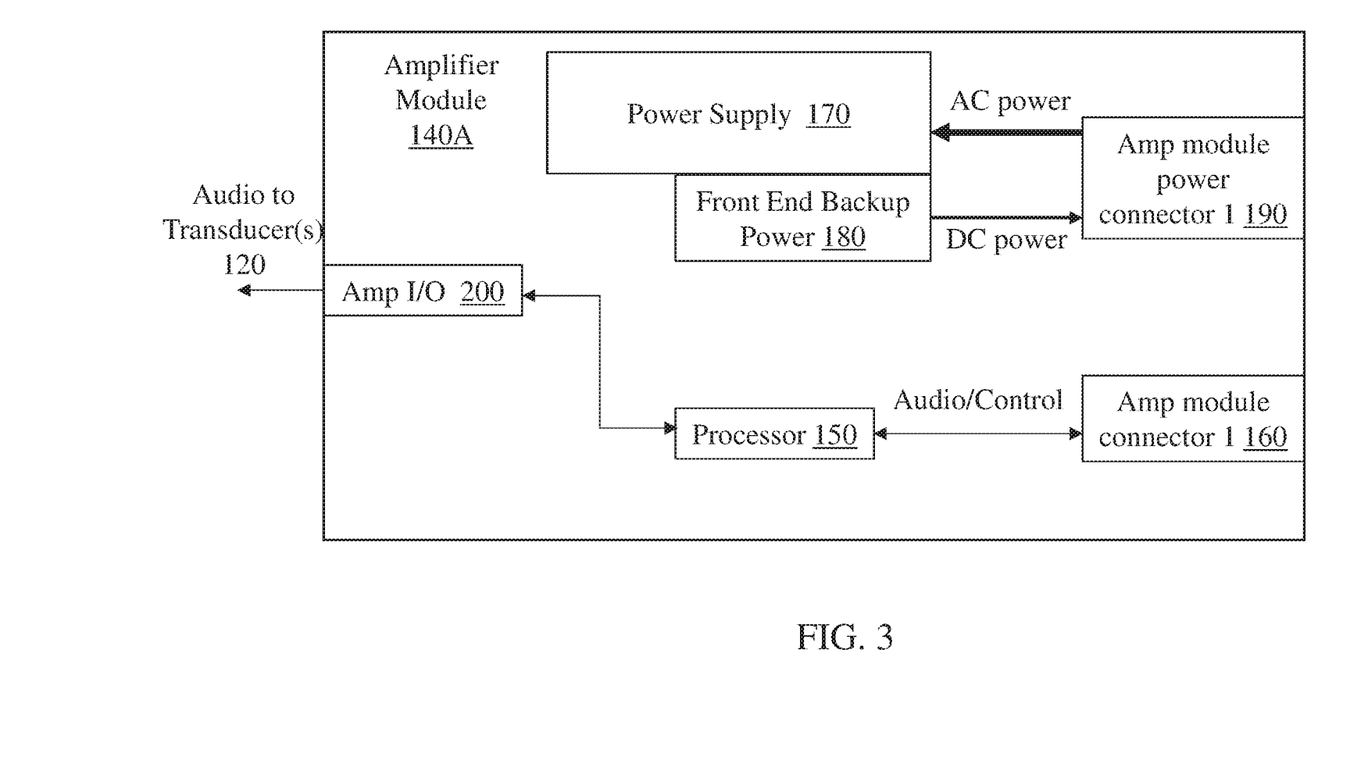
FIG. 3 illustrates components in a module according to various implementations.

FIG. 3 illustrates a simplified example of a first module 140, e.g., an amplifier module 140A in a speaker 20 according to various implementations. In some cases, a given speaker 20 can include more than one amplifier module 140. In certain cases, each speaker 20 in a set 30 (FIG. 1) includes amplifier module 140A. As shown, the amplifier module 140A can include a processor 150, and an audio signal and control connector 160 coupled with the processor 150. The audio signal and control connector 160 enables one-way or two-way audio signal and control communication between the processor 150 and another module 140 in the speaker system, e.g., power module 140B and/or network module 140C in the same speaker 20, or another module 140A, B, C in a distinct speaker 20. In particular implementations, the audio signal and control connector 160 enables (e.g., one-way or two-way) audio signal and control communication between the processor 150 and a similar processor in another module (e.g., network module 140C) in the loudspeaker 20 or in a distinct loudspeaker 20 in a set 30, or in another set 30 of loudspeakers (FIG. 1). In certain cases, as noted herein, the modules 140 (e.g., power modules 140B and network modules 140C) in successive speakers 20 are connected in a daisy chain, such that both power connection 90 and audio signal and control connections 100 are made with adjacent loudspeakers 20 and not necessarily the source power and signal distribution block 40.

In various implementations, the amplifier module 140A also includes a dedicated power supply 170 for the loudspeaker 20. The amplifier module 140A also has a front end backup power supply 180 that can be used to provide backup power when desirable (as noted herein). In various implementations, the front end backup power supply 180 is part of the dedicated power supply 170 and is selectively tapped for providing backup power functions as described herein. A power connector 190 is shown coupled with the dedicated power supply 170 and the front end backup power supply 180. The power connector 190 enables input power to the dedicated power supply 170 (e.g., from the power and signal distribution block 40, FIG. 1), as well as output power from the front end backup power supply 180. In various implementations, the power connector 190 also enables diagnostic communication about the power supply, such as battery charge level, power detection, input voltage, etc. In various implementations, the input power is alternating current (AC) power. Additionally, as described herein, when providing output power, the front end backup power supply 180 is configured to provide direct current (DC) power, e.g., to a front end power supply for a control circuit. It is understood that the power connector 190 can be separate from the first module 140A in some cases, e.g., where the power connector 190 is a separate device configured to be selectively coupled with an input to the first module 140A. The processor 150 is configured to control the amplifier inputs and outputs 200, including sensor(s) inputs, outputs to fans and other temperature control components, and inputs/outputs to driver (transducer) connectors, such as low-frequency, mid-frequency and high-frequency driver outputs. The processor 150 is also configured to send and receive audio and control signals via the amplifier module connector 160.

Figure 4:
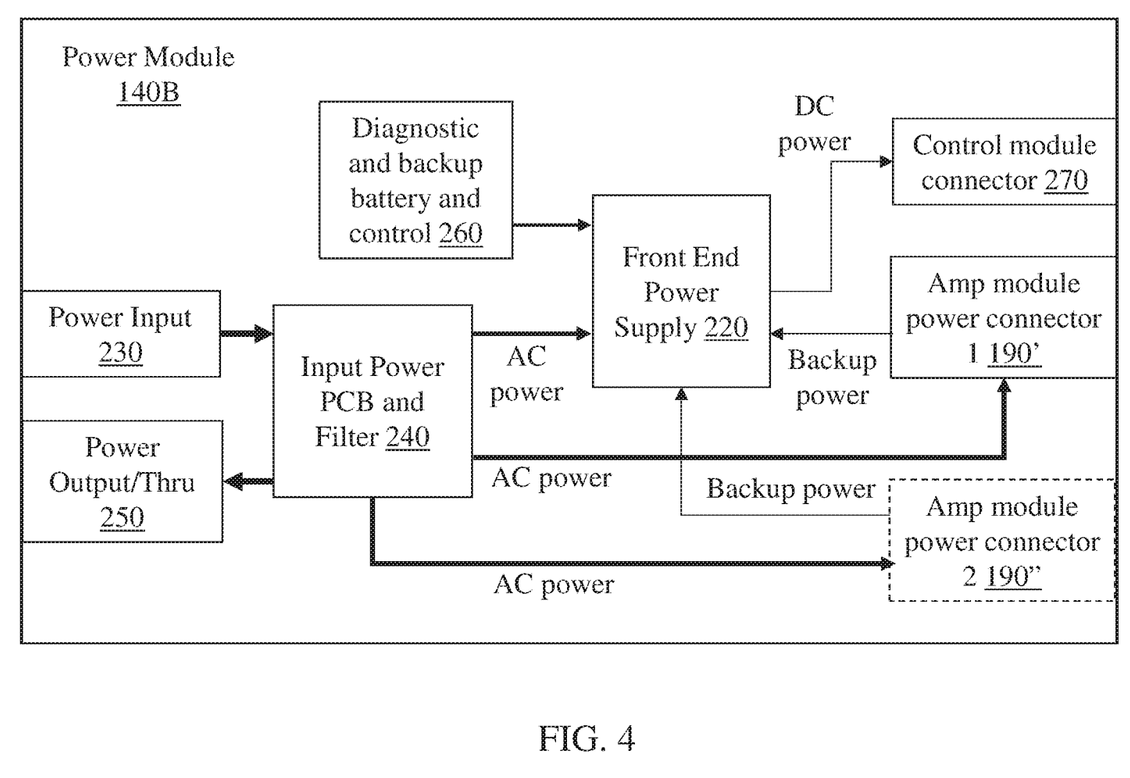
FIG. 4 illustrates components in another module according to implementations.

FIG. 4 shows a schematic illustration of another module 140, e.g., a power module 140B according to various implementations. In certain cases, a given loudspeaker 20 (FIG. 1) includes a pair of amplifier modules 140A, with at least one such amplifier module 140A connected with a power module 140B and at least one such amplifier module 140A connected with a network module 140C. In particular examples, e.g., as illustrated in FIG. 2, the Left and Right sides of the loudspeaker each have an amplifier module 140A and one of a power module 140B or a network module 140C. It is understood that modules 140A, 140B, 140C can communicate with one another to perform various functions described herein. Additionally, commonly labeled components in modules can indicate a common component or a connection between components, e.g., hard-wired and/or wireless connection. In certain cases, component connections are labeled with prime (') or double prime (") indicators to show possible connections between similarly labeled components in different modules.

As shown in FIG. 4, the amplifier module 140B includes a front end power supply 220 that receives input power from a power input 230 to the speaker 20, e.g., from one of the power outputs at the power and signal distribution block 40 (FIG. 1), which may have been passed through other loudspeakers 20 in the illustrated daisy-chain arrangement. The power input 230 is intermediately connected with a power printed circuit board (PCB) and filter 240 that is configured to control power demands for the modules 140A, 140B, 140C, etc. The input power PCB and filter 240 is also configured to control power output and power throughput via power output/thru connection 250. In some cases, e.g., in the daisy chained power configurations described herein, the input power PCB and filter 240 is configured to control power distribution to downstream (or, down-chain) modules in one or more speakers 20. Additionally, the input power PCB and filter 240 can control AC power distribution to other modules, e.g., modules 140A. That is, the input power PCB and filter 240 is configured to send AC power to modules 140A that ultimately can provide backup power to the front end power supply 220, as described herein. In certain implementations, the amplifier 140B has a diagnostic and backup battery and control module 260 that is configured to provide diagnostic data about the power supply.

Also illustrated in FIG. 4, the front end power supply 220 is configured to receive backup power via at least one amplifier module power connector, e.g., amplifier module power connectors 190' and 190". In various implementations, the backup power is received, when needed, via the amplifier module power connector 190 from amplifier module 140A. In particular cases, module 140B can be coupled with two (or more) distinct modules 140A, that each provide backup power from respective power connectors 190', 190".

A second example power connector 190″ is illustrated in phantom as optional. Additionally, in some cases, additional amplifier modules 140A can be coupled with the power module 140B to drive additional transducers 120 and to provide further backup power sources to the front end power supply 220.

Figure 5:
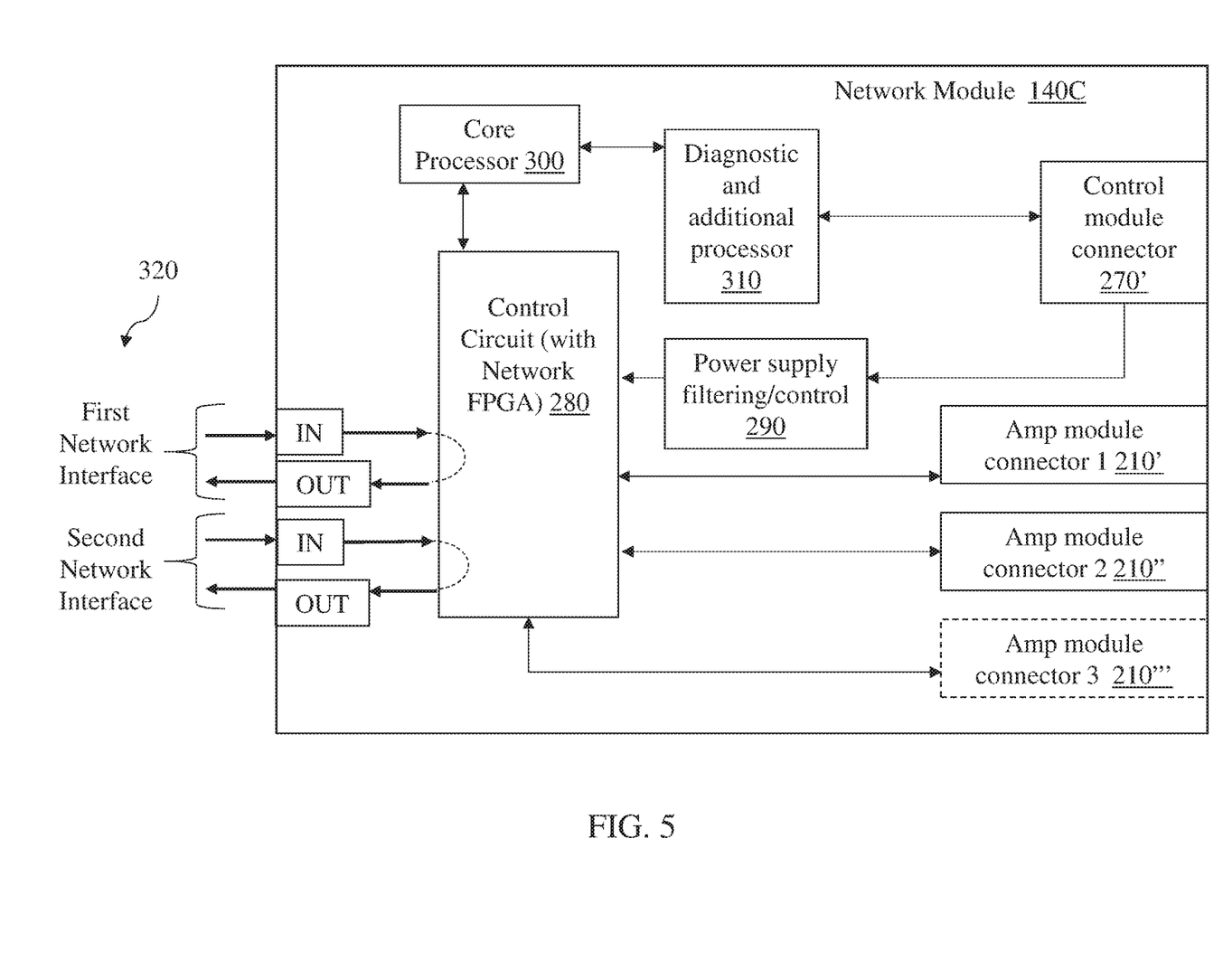
FIG. 5 illustrates components in yet another module according to various implementations.

The front end power supply 220 sends DC power to a control module connector 270, which in turn powers the network module 140C shown in FIG. 5. That is, the control module connector 270 is connected with or otherwise integral with control module connector 270′ in module 140C, which powers a control circuit 280 (e.g., after power supply filtering 290). In certain cases, the control circuit 280 includes a field programmable gate array (FPGA) section for managing audio signal and control routing, switching and interconnections in the loudspeaker 20. The control circuit 280 is coupled with a core processor 300 for performing processing functions on the speaker 20. In some cases, one or more processing functions can be performed by the core processor 300 and/or the FPGA in the control circuit 280. An additional processor 310, e.g., for diagnostics of core processor 300 functions and control module connector 270 power supply, can be deployed as well in some implementations. The control circuit 280 couples with amplifier module(s) 140A via connectors 210 to provide audio data and control signals to and from the amplifier module(s) 140A, and in some optional implementations, is coupled with a power connector 190 from module(s) 140A and/or 140B.

Figure 6:
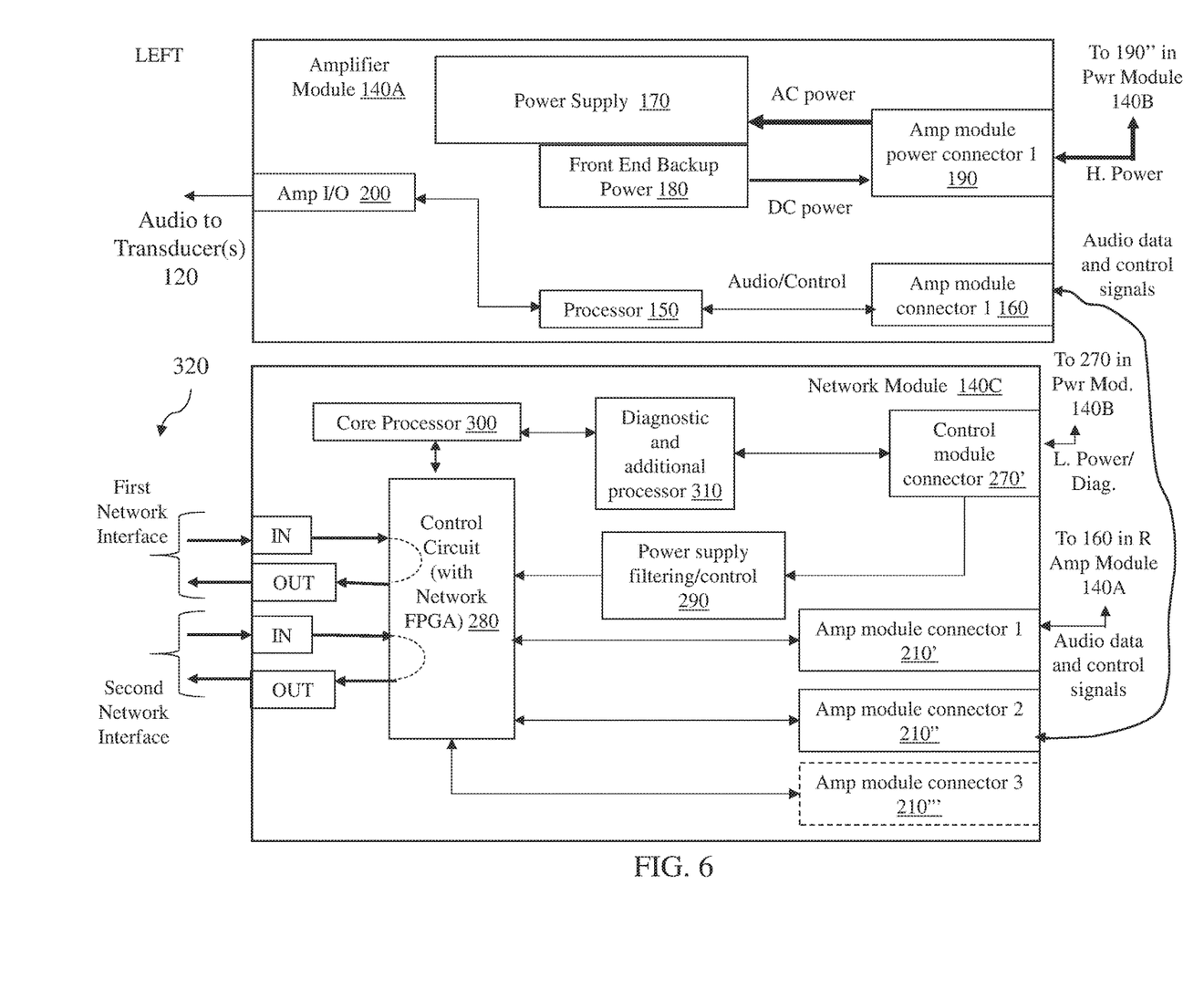
FIG. 6 illustrates modules and component connections in a left side of a loudspeaker according to various implementations.
Figure 7:
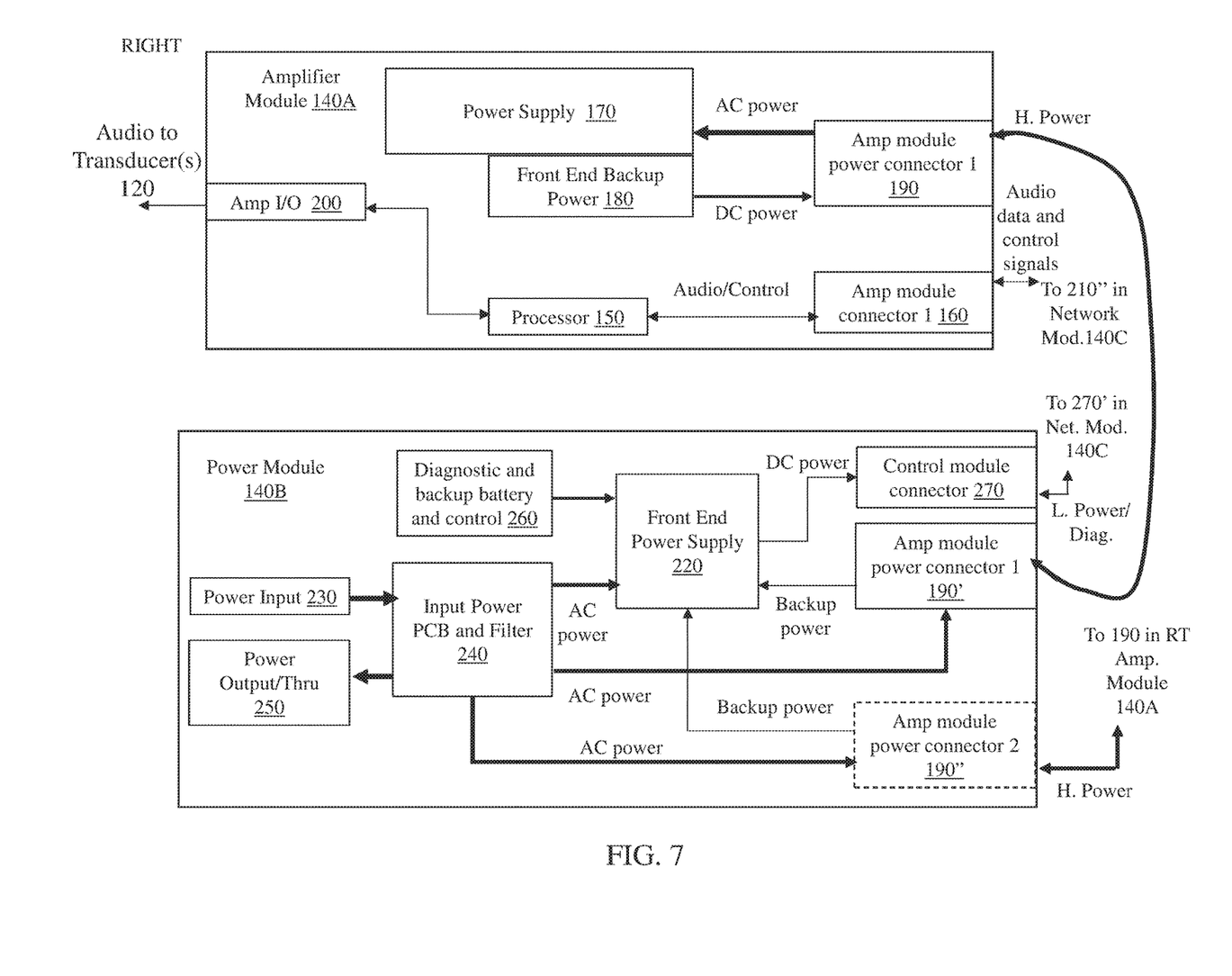
FIG. 7 illustrates modules and component connections in a right side of a loudspeaker according to various implementations.

Examples depictions of signal flow and power connections in Left and Right sides of the loudspeaker 20 in FIG. 2 are illustrated in greater detail in FIGS. 6 and 7. FIG. 6 shows the flow of higher (relative) power between amplifier module 140A (at power connector 190) and power module 140B (at power connector 190″). In various implementations, this relatively higher power is AC power for supplying the amplifier module 140A. FIG. 6 also shows audio data and control signals sent between module connectors 160 and 210″ in the amplifier module 140A and network module 140C, respectively. FIG. 6 also shows audio data and control signals sent between the network module 140C and the amplifier module 140A in the Right side of loudspeaker 20. Lower (relative) power (e.g., backup, DC power), along with diagnostic power data, is sent between the control module connector 270′ in the network module 140C and the control module connector 270 in the power module 140B (FIG. 7). FIG. 7, showing connections on the Right side of loudspeaker 20, illustrates additional aspects of the connections in FIG. 6, along with the higher (relative) power connection between the amplifier module 140A and the power module 140B on the Right side.

With reference to FIGS. 3-7, in some cases, network audio is routed by the control circuit 280, e.g., by the FPGA. In particular cases, the control circuit 280 sends, receives or otherwise forwards network audio and control communications through the daisy chain of speakers 20 via network interfaces 320. It is understood that in operation of the system 10, network interfaces 320 in distinct loudspeakers 20 are connected with one another in the daisy chain. As noted herein, maintaining power to the control circuit 280 enables the speaker 20 to continue outputting audio even when a power supply failure occurs. That is, the front end backup power 180 (FIG. 3) is able to provide sufficient power to the power supply 220 (FIG. 4) such that the control circuit 280 remains operational during a power failure to the speaker 20. In particular, this backup power is sufficient to support the FPGA in controlling audio signal and control communication. In some cases, the output (backup) power is available for use in response to a failure at the front end power supply 220. In these cases, when the front end power supply 220 indicates a failure or predicts an upcoming failure in the power supply (e.g., when a detected DC voltage of the front end power supply 220 drops below a threshold voltage), it draws on front end backup power 180 from module(s) 140A in order to supply the control circuit 280. In certain implementations, the backup power is sufficient to support the FPGA for a defined period, and in particular cases, is sufficient to support the FPGA indefinitely during operation of the loudspeaker 20.

With reference to FIGS. 1-7, and particular reference to FIGS. 1 and 5, as noted herein, the speakers 20 in a given set 30 or group of sets 30 can be connected in a daisy chain. In addition to the power supply configuration described with reference to FIGS. 3-5, the FPGA in control circuit 280 can provide particular benefits for controlling audio signal and control signal communications among speakers 20 in the system 10. In one example, each speaker 20 has an amplifier module 140C with a control circuit 280 that includes an FPGA. The use of an FPGA is distinct from conventional daisy chained speaker configurations that rely on one or more network switches for managing audio and control signal communications among speakers. In particular, the FPGA can be used in a beneficial approach for managing audio and control signals among speakers. In one example, the signal distribution output 50 (FIG. 1) is configured to send digital audio signals and control signals directly to multiple speakers 20 in a set 30. For instance, the signal distribution output 50 can send digital audio signals and control signals directly (i.e., without sending to intervening speakers 20) to the first and fourth speakers 20 in a set 30, or to the first, third and last speakers 20 in a set 30, or to the first, middle and last speakers 20 in a set 30. In these examples, the FPGA in an amplifier module 140C at one or more of the speakers 20 is configured to control the digital signals (e.g., audio and/or control) sent to all of the speakers 20 in the set 30. In a particular cases, the FPGA in amplifier module(s) 140C is configured to control digital audio signals sent to at least two speakers 20 in a set 30 in order to mitigate latency between the digital audio signals received at a first speaker 20 and a later, downstream (or down-chain) speaker 20. In certain cases, such as when the format of the audio data from the signal distribution block 50 is a continuous audio stream, the FPGA (in control circuit 280) can be configured to forward digital audio signals from the network interface(s) (e.g., first network interface 320) to corresponding network audio thru interfaces (e.g., second network interface 320) as a continuous audio stream. In various implementations, because the audio signals are known as pertaining to the closed network of speakers 20 in a set 30 (or multiple sets 30), the FPGA need not analyze those audio signals before forwarding onward. For example, the FPGA need not analyze the audio signals for differences in port speed between source and destination addresses before forwarding to the network audio thru interface 320. As such, and in contrast to conventional approaches, the FPGA forwards digital audio signals as packetized datagrams from network audio input interfaces to corresponding network audio thru interfaces, and begins transmitting each packetized datagram before completely receiving the packetized datagram. Additionally, the FPGA forwards the packetized datagrams without regard for a destination address. This process can mitigate latency in the digital audio signals and enhance the quality of the audio output at the system 10.

One or more components in the speaker system 10 can be formed of any conventional loudspeaker material, e.g., a heavy plastic, metal (e.g., aluminum, or alloys such as alloys of aluminum), composite material, etc. It is understood that the relative proportions, sizes and shapes of the speaker system 10 and components and features thereof as shown in the FIGURES included herein can be merely illustrative of such physical attributes of these components. That is, these proportions, shapes and sizes can be modified according to various implementations to fit a variety of products.

As used herein, controllers and/or control circuit(s), where applicable, can include a processor and/or microcontroller, which in turn can include electro-mechanical control hardware/software, and decoders, DSP hardware/software, etc. for playing back (rendering) audio content at the speakers 20, as well as for communicating with other components in the speaker system 10. The control circuit(s) can also include one or more digital-to-analog (D/A) converters for converting the digital audio signal to an analog audio signal. This audio hardware can also include one or more amplifiers which provide amplified analog audio signals to the speakers 20. In additional implementations, the controller/control circuit(s) include sensor data processing logic for processing data from sensors.

The functionality described herein, or portions thereof, and its various modifications (hereinafter "the functions") can be implemented, at least in part, via a computer program product, e.g., a computer program tangibly embodied in an information carrier, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the functions can be performed by one or more programmable processors executing one or more computer programs to perform the functions of the calibration process. All or part of the functions can be implemented as, special purpose logic circuitry, e.g., an FPGA and/or an ASIC (application-specific integrated circuit). Processors suitable for the execution of a computer program include, by way of example, both general and special purpose microprocessors, and any one or more processors of any kind of digital computer. Generally, a processor will receive instructions and data from a read-only memory or a random access memory or both. Components of a computer include a processor for executing instructions and one or more memory devices for storing instructions and data.

Elements of figures are shown and described as discrete elements in a block diagram. These may be implemented as one or more of analog circuitry or digital circuitry. Alternatively, or additionally, they may be implemented with one or more microprocessors executing software instructions. The software instructions can include digital signal processing instructions. Operations may be performed by analog circuitry or by a microprocessor executing software that performs the equivalent of the analog operation. Signal lines may be implemented as discrete analog or digital signal lines, as a discrete digital signal line with appropriate signal processing that is able to process separate signals, and/or as elements of a wireless communication system.

When processes are represented or implied in the block diagram, the steps may be performed by one element or a plurality of elements. The steps may be performed together or at different times. The elements that perform the activities may be physically the same or proximate one another, or may be physically separate. One element may perform the actions of more than one block. Audio signals may be encoded or not, and may be transmitted in either digital or analog form. Conventional audio signal processing equipment and operations are in some cases omitted from the drawings.

In various implementations, electronic components described as being "coupled" can be linked via conventional hard-wired and/or wireless means such that these electronic components can communicate data with one another. Additionally, sub-components within a given component can be considered to be linked via conventional pathways, which may not necessarily be illustrated.

Other embodiments not specifically described herein are also within the scope of the following claims. Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

We claim:

1. A self-powered speaker system, comprising:
   a first module, comprising:
   a processor;
   an audio signal and control connector coupled with the processor and enabling audio signal and control communication between the processor and another module in the speaker system;
   a dedicated power supply for the speaker system;
   a front end backup power supply;
   a power connector coupled with the dedicated power supply and the front end backup power supply, the power connector enabling input power to the dedicated power supply and output power from the front end backup power supply; and
   a control circuit for mitigating latency in audio signal and control communication between modules.

2. The system of claim 1, wherein the input power is AC power from an input power source, and wherein the output power is DC power that is sent to a front end power supply for a control circuit.

3. The system of claim 2, wherein the control circuit comprises a field programmable gate array (FPGA) section for controlling the audio signal and control communication.

4. The system of claim 3, wherein the output power is available for use in response to a front end power supply failure.

5. The system of claim 4, wherein the output power is sufficient to support the FPGA section for a defined period.

6. The system of claim 1, further comprising a second module comprising:
   a processor;
   an audio signal and control connector coupled with the processor and enabling audio signal and control communication between the processor and another module in the speaker system;
   a dedicated power supply for the second module;
   a front end backup power supply; and a power connector coupled with the dedicated power supply and the front end backup power supply, the power connector enabling input power to the dedicated power supply and output power from the front end backup power supply.

7. The system of claim 1, wherein the first module and another module in the speaker system each comprise an amplifier module and are connected in a daisy chained connection.

8. A self-powered line array, comprising:
a set of speaker systems, each comprising:
a first module, comprising:
a processor;
an audio signal and control connector coupled with the processor and enabling audio signal and control communication between the processor and another module in the speaker system;
a dedicated power supply for the speaker system;
a front end backup power supply; and
a power connector coupled with the dedicated power supply and the front end backup power supply, the power connector enabling input power to the dedicated power supply and output power from the front end backup power supply,
wherein amplifier modules in each speaker system are connected by a daisy chained connection.

9. The line array of claim 8, wherein each of the speaker systems further comprises a second module, comprising:
a processor;
an audio signal and control connector coupled with the processor and enabling audio signal and control communication between the processor and another module in the speaker system;
a dedicated power supply for the second module;
a front end backup power supply; and
a power connector coupled with the dedicated power supply and the front end backup power supply, the power connector enabling input power to the dedicated power supply and output power from the front end backup power supply.

10. The line array of claim 8, wherein each speaker system further comprises:
an input power source;
a front end power supply; and
a control circuit connected with the front end power supply.

11. The line array of claim 10, wherein the input power is AC power from the input power source, and wherein the output power is DC power that is sent to the front end power supply for powering the control circuit.

12. The line array of claim 10, wherein the control circuit comprises a field programmable gate array (FPGA) section for controlling the audio signal and control communication.

13. The line array of claim 12, wherein the output power is available for use in response to a front end power supply failure, and wherein the output power is sufficient to support the FPGA section for a defined period.

14. The line array of claim 8, further comprising:
a power distribution block configured to provide power to each of the speaker systems; and
a signal distribution block configured to provide digital audio signals and control signals to each of the set of speaker systems,
wherein, other than the first module, at least one additional module is configured to receive digital audio signals and control signals directly from the signal distribution block, and
wherein the at least one additional module is located between the first module and a last module in the set.

15. The line array of claim 14, wherein the digital audio signals sent to the first module and the at least one additional module are controlled by a field programmable gate array (FPGA), wherein the FPGA mitigates latency between the digital audio signals received at the first module and the at least one additional module,
wherein the FPGA forwards digital audio signals as packetized datagrams from network audio input interfaces to corresponding network audio thru interfaces, and begins transmitting each packetized datagram before completely receiving the packetized datagram.

16. The line array of claim 15, wherein the FPGA forwards the packetized datagrams without regard for a destination address.

17. A method of controlling a first module in a line array speaker system, the method comprising:
sending and receiving audio signal and control communications with another module in the speaker system; and
sending backup power from a front end backup power supply to a front end power supply for a control circuit that comprises a field programmable gate array (FPGA) section for controlling the audio signal and control communications.

18. The method of claim 17, further comprising receiving input AC power from a power source, wherein the backup power comprises DC power.

19. The method of claim 17, further comprising:
receiving the audio signal and control communications at the first module from a a signal distribution block that also provides audio signal and control communications to each of a set of speaker systems in the line array,
wherein the other module is in a distinct speaker system in the line array from the first module, and wherein audio signal and control communications sent to the first module and the other module are controlled by the FPGA.

20. The method of claim 19, wherein the FPGA mitigates latency between the audio signal and control communications received at the first module and the other module.

21. The method of claim 20, wherein the audio signal and control communications comprise digital audio signals, wherein the FPGA forwards the digital audio signals as packetized datagrams from network audio input interfaces to corresponding network audio thru interfaces, and begins transmitting each packetized datagram before completely receiving the packetized datagram, wherein the FPGA forwards the packetized datagrams without regard for a destination address.

* * * * *